United States Patent [19]

Matsuoka et al.

[11] Patent Number: 4,846,703
[45] Date of Patent: Jul. 11, 1989

[54] IC SOCKET

[75] Inventors: Noriyuki Matsuoka; Junji Ishida, both of Tokyo, Japan

[73] Assignee: Yamaichi Electric Mfg. Co., Ltd., Japan

[21] Appl. No.: 262,025

[22] Filed: Oct. 25, 1988

[30] Foreign Application Priority Data

Oct. 31, 1987 [JP] Japan .................. 62-277220

[51] Int. Cl.[4] .................. H01R 9/09; H01R 13/15
[52] U.S. Cl. .................. 439/71; 439/73; 439/81; 439/264; 439/266; 439/330
[58] Field of Search .................. 439/71, 73, 80–82, 439/261, 263–266, 330, 358

[56] References Cited

U.S. PATENT DOCUMENTS

| | | | |
|---|---|---|---|
| 4,386,815 | 6/1983 | Carter et al. | 439/81 |
| 4,427,249 | 1/1984 | Bright et al. | 439/71 |
| 4,498,047 | 2/1985 | Hexamer et al. | 339/17 F |
| 4,560,216 | 12/1985 | Egawa | 339/17 CF |
| 4,630,875 | 12/1986 | Korsunsky et al. | 439/73 |
| 4,710,134 | 12/1987 | Korsunsky | 439/264 |
| 4,750,890 | 6/1988 | Dube et al. | 439/330 |
| 4,758,176 | 7/1988 | Abe et al. | 439/73 |
| 4,786,256 | 11/1988 | Angeleri et al. | 439/330 |
| 4,789,345 | 12/1988 | Carter | 439/71 |
| 4,799,897 | 1/1989 | Mogi et al. | 439/266 |
| 4,801,273 | 1/1989 | Ikeya et al. | 439/264 |

FOREIGN PATENT DOCUMENTS 58-30295 2/1983 Japan .

*Primary Examiner*—P. Austin Bradley
*Attorney, Agent, or Firm*—Wenderoth, Lind & Ponack

[57] ABSTRACT

An IC socket has an IC supporting means which can be moved between an upper and a lower positions with an IC mounted on it, a first spring means for energizing the IC supporting means so that the IC supporting means is pushed up to the upper position, a contact for contacting with a lead of the IC when the IC supporting means is moved to the lower position against the force of the first spring means, an IC vertical movement operating means which can be moved between the upper and lower positions and adapted to push down the IC supporting means against the first spring means, a second spring means for energizing the IC vertical movement operating means so as to push up the same to the upper position, and a lock means for retaining the IC supporting means to the lower position against the force of the first spring means by the vertical movement operation of the IC vertical movement operating means against the force of the second spring means or in accordance with the force of the second spring so that the IC is brought into contact with the contact. The retaining of the IC supporting means is released by the second vertical movement operation of the IC vertical movement operating means to allow the IC supporting means to be moved to the upper position in accordance with the force of the first spring means.

5 Claims, 12 Drawing Sheets

FIG. 24
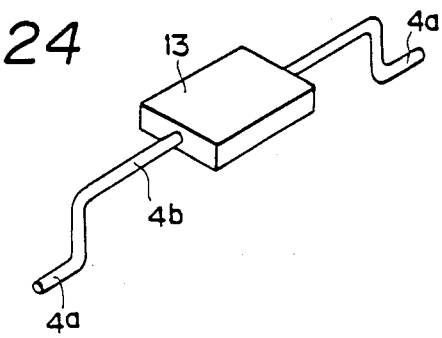
FIG. 25(A)
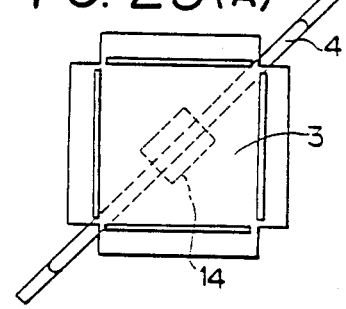
FIG. 25(B)
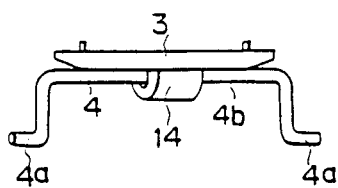
FIG. 26(A)  FIG. 26(B)  FIG. 26(C)
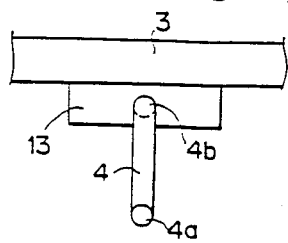 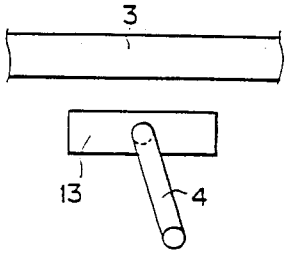 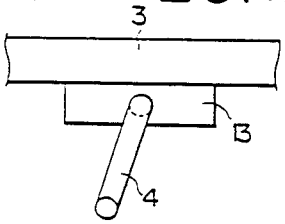
FIG. 27(A)  FIG. 27(B)  FIG. 27(C)
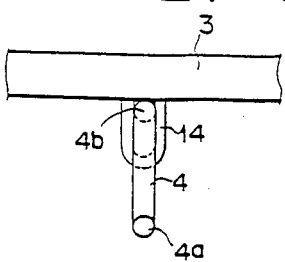 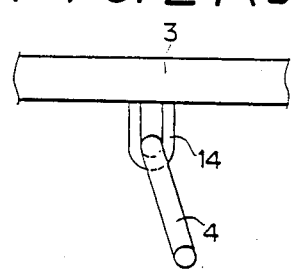 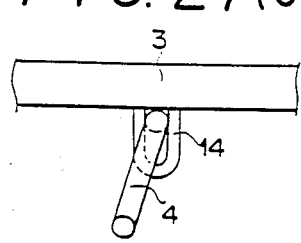

IC SOCKET

BACKGROUND OF THE INVENTION

1. Field of the Invention

This invention relates to an IC socket which is suitable for connecting and disconnecting a flat IC to and from a socket, and more particularly to an IC socket which is designed as such that an IC can be easily handled when the IC is connected and disconnected to and from the socket.

2. Description of the Prior Art

There has been known an IC socket provided with a mechanism for opening and closing a contact so that an integral circuit (IC) can be mounted or removed without loads. However, in the case the integral circuit comprises a minute and flat chip, it is difficult to remove the IC from the IC socket even when contact resistance is in a released state or is zero because it has few portions which can be grasped. If a pincette or the like is used for the removal, there is a possibility that the IC leads and contact are damaged by mistake. Moreover, adoption of a pincette or the like badly spoils the efficiency of the IC removing work.

In order to solve the above-mentioned problems, there has been known an IC socket, as represented by Japanese Utility Model Application Early Laid-open Publication No. Sho 58-30295, in which an IC socket is provided with a sing-and-float table for supporting thereon an IC, the IC being held by a spring so that the supporting table is energized upward, the IC together with the supporting table being pushed down against the force of the spring by closing a presser cover pivotably mounted on the IC socket so that the IC is contacted with the contact, the supporting table and IC being pushed up by the spring by opening the cover so that the IC can be removed from the IC socket. However, even if the IC is pressed by the presser cover, not only the IC and supporting table but also the presser cover itself tend to be floated up by the pushing-up force of the spring because the pushing-up force of the spring is always applied to the IC supporting table and IC, and thus the contact between the IC lead and the contact becomes unstable. In addition, the amount for pushing down the IC and IC supporting table by the presser cover is limited, and therefore, the pushing-up amount is also limited. Thus, much difficulty is accompanied when the IC socket is to be designed as such that the IC and IC supporting table is pushed up to the extent sufficient to remove the IC from the IC socket.

There has also been proposed another IC removing device, as disclosed in U.S. Pat. No. 4,560,216, in which the presser cover is provided with a suction cup means for sucking the upper surface of the IC so that when the cover is opened, the IC is immediately extracted. However, it takes much time and labor to remove the IC from the suction cup means. On the contrary, if the suction force is insufficient, the IC tends to come off easily. In addition, it has such an inconvenience as that the suction cup means becomes deteriorated and unable to firmly suck the IC.

Furthermore, U.S. Pat. No. 4,498,047 discloses a device, in which an IC is directly pushed down to move a stage member with the IC mounted thereon downward against a spring, the stage member being brought into engagement with a lock mechanism in the lower position to maintain a contact, the lock member being unlocked by pressing the IC again in order to move the stage member with the IC mounted thereon to an upper position. In this device, in order to move the IC to an upper or lower position, a pressure must be given to the IC directly.

This conventional device has such disadvantages as that although there is a risk that the IC is broken when a mechanical external pressure is incurred to the IC, such an undesirable pressure must be incurred to the IC. Furthermore, when the IC is pressed, the IC is often displaced or inclined to deform the lead and contact, or an erroneous contact is taken place. Furthermore, in the above-mentioned prior art, when the IC is moved downward, it is brought into the state where the IC is pushed into the socket. Therefore, in order to press the IC again, a finger must be inserted into a narrow space and thus very inconvenient to operate.

SUMMARY OF THE INVENTION

It is therefore an object of the present invention to provide an IC socket in which an IC supporting means can be move to an upper and a lower positions without incurring such an undesirable pressure as mentioned by pressing an IC vertical movement operating means which is normally returned to and held in an upper position.

Another object of the present invention is to provide an IC socket in which IC breakage or lead deformation caused by direct pressure incurred to the IC can be effectively prevented.

A further object of the present invention is to provide an IC socket in which the IC vertical movement operating means is normally returned to the upper position as mentioned so that the IC can be pressed easily.

In order to achieve the above objects, there is essentially provided an IC socket comprising an IC supporting means which can be moved between an upper and a lower positions with an IC mounted thereon, a first spring means for energizing the IC supporting means so that the IC supporting means is pushed up to the upper position, a contact for contacting with a lead of the IC when the IC supporting means is moved to the lower position against the force of the first spring means, an IC vertical movement operating means which can be moved between the upper and lower positions and adapted to push down the IC supporting means against the first spring means, a second spring means for energizing the IC vertical movement operating means so as to push up the same to the upper position, and a lock means for retaining the IC supporting means to the lower position against the force of the first spring means by the vertical movement operation of the IC vertical movement operating means against the force of the second spring means or in accordance with the force of the second spring so that the IC is brought into contact with the contact, the retaining of the IC supporting means being released by the second vertical movement operation of the IC vertical movement operating means to allow the IC supporting means to be moved to the upper position in accordance with the force of the first spring means.

Since the present invention is constituted in such a manner as mentioned above, the IC mounted on the IC supporting table can be moved to the lower position without incurring any external force such as pressing load to the IC by means of pressing operation of the IC vertical movement operating means, so that the IC supporting means is brought into engagement with the local means and so that the IC is brought into contact with the contact. Therefore, the IC can be moved between the upper and lower positions without incurring an undesirable pressing force. Therefore, there can effectively prevent the occurrence of undesirable incidents such as displacement of the IC, deformation of the lead or contact, erroneous contact of the lead and contact, etc. which are frequently occurred when the IC is directly pressed by finger.

Furthermore, according to the present invention, since the IC vertical movement operating means is normally returned to and waiting in the upper position even when the IC and the IC supporting table are present in the lower position, the next following pressing operation can be performed easily, and a first and a second pressing operation as well as the vertical movement of the IC can be properly performed always under the same condition.

These and other objects, features and advantages of the present invention will be well appreciated upon reading of the present invention when taken in conjunction with the attached drawings with understanding that some modifications, variations, and changes could be done by a skilled person in the art to which the present invention pertains without departing from the spirit of the present invention or the scope of claims appended thereto.

BRIEF DESCRIPTION OF THE DRAWINGS

For a better understanding of the present invention, reference is made to the attached drawings wherein;

FIGS. 9, 12, 15, 18 and 21 are sectional views taken on line IX—IX of FIG. 2 which show the operating state thereof in such a manner as one stage of operation comes after another;

FIGS. 10, 13, 16, 19 and 22 are sectional views taken on line X—X of FIG. 8 which show each operating state corresponding to each of the above-mentioned figures in such a manner as one stage of operation comes after another;

FIGS. 11, 14, 17, 20 and 23 are sectional views taken along line XI—XI of FIG. 8 but from which the framework is removed and showing each operating state corresponding to each of the above-mentioned figures in such a manner as one stage of operation comes after another;

FIG. 24 is a perspective view showing another example of a pedestal supporting member forming an IC supporting means;

FIG. 25A is a plan view showing a still further example of the IC supporting means;

FIG. 25B is a plan view thereof;

FIGS. 26A, 26B and 26C are side views for explaining the operating state of the IC supporting means of FIG. 24; and FIGS. 27A, 27B and 27C are side views for explaining the operating state of the IC supporting means of FIGS. 25A and 25B.

DETAILED DESCRIPTION OF THE EMBODIMENT

Figure 1:
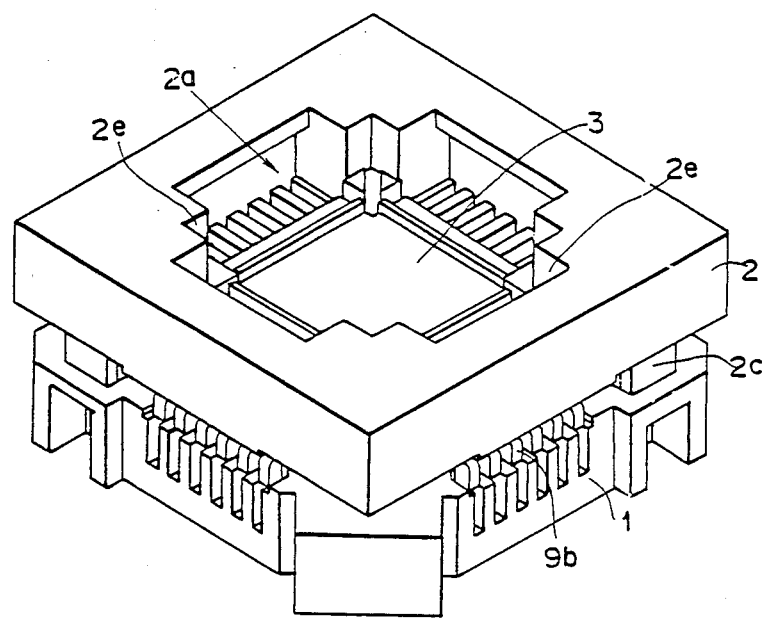
FIG. 1 is a perspective view of an IC socket according to one embodiment of the present invention.
Figure 2:
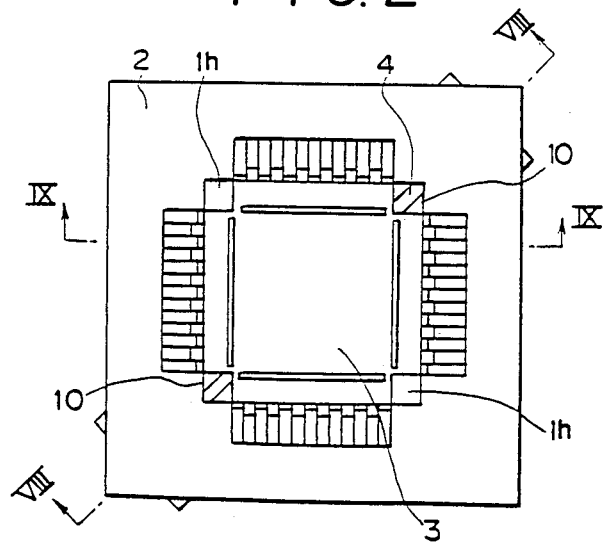
FIG. 2 is a plan view thereof.
Figure 3:
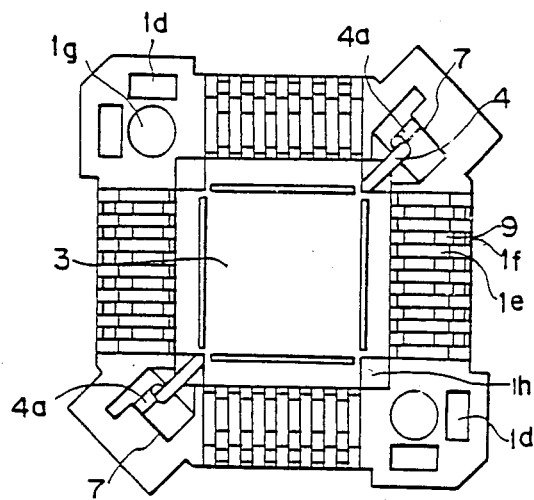
FIG. 3 is a plan view of the above but from which a framework is removed.
Figure 4:
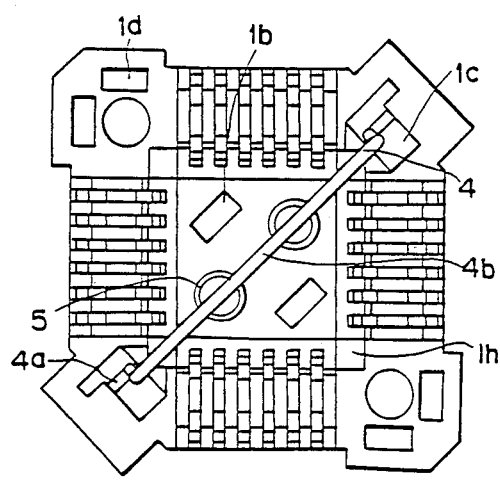
FIG. 4 is a plan view of the above but from which the framework and an IC pedestal are removed.

The preferred embodiment of the present invention will be described with reference to the accompanying drawings 1 through 27.

As already described, the present invention includes an IC supporting means with an IC mounted thereon and movable between an upper and a lower positions, and a first spring means for returning the supporting means to the upper position.

The present invention further includes a lock means for retaining the IC supporting means in the lower position and releasing the retaining in order to allow the IC supporting means to return to the upper position.

The present invention further includes an IC vertical movement operating means for vertically moving the IC supporting means between the upper and lower positions. The IC vertical movement operating means is vertically movable between the upper and the lower positions and is normally energized upward by a second spring means in such a manner as to be pushed up to the upper position. The IC vertical movement operating means is pushed downward by finger etc. against the force of the second spring means. Due to the foregoing push-down operation, the IC supporting means is pushed downward to the lower position against the force of the first spring means so that the IC supporting means is engaged with the lock means. In the meantime, the IC vertical movement operating means is self-returned to the upper position by the biasing force of the second spring means. By a second push-down operation against the force of the second spring means, the IC vertical movement operating means is pushed downward toward the lower position to disengage the IC supporting means from the lock means. In the meantime, the IC vertical movement operating means is self-returned to the upper position. At the same time, the IC vertical movement operation means moves the IC supporting means to the upper position according to the biasing force of the first spring means.

1 denotes a socket substrate. The socket substrate 1 is provided at the central portion thereof with a generally square-shaped IC accommodating section 1a and around the entire periphery or along the two sides of the IC package accommodating section 1a with a plurality of partition walls 1e disposed in juxtaposed relation with each other. A groove 1f is formed between the adjacent partition walls 1e and the grooves 1f is each provided therein with a contact 9 for contacting with a corresponding IC lead.

The contact 9 includes a terminal portion 9c penetrating throughout the socket substrate 1 and projecting out of the lower surface of the socket substrate 1, a spring portion 9d connected to the terminal portion 9c and directing upward therefrom, a pressure receiving portion 9b connected to the spring portion 9d and directing toward the rear part of the spring portion 9d, and a contact portion 9a projecting forward and downward from the connecting part of the pressure receiving portion 9b and the spring portion 9d.

The IC supporting means and the IC vertical movement operating member are disposed in such a manner as that they are in correspondence with the IC accommodating section 1a of the socket substrate 1.

In the first embodiment (see FIGS. 1 through 23), the IC supporting means comprises an IC pedestal 3 on which the IC is mounted and a pedestal supporting member 4 for supporting the IC pedestal 3 in a non-connected fashion.

The IC pedestal 3 is formed in a generally square shape and provided with legs 3b projecting downward from the lower surface of the pedestal 3. The IC pedestal 3 allows the legs 3b each to be vertically movably inserted into a guide hole 1b formed in a bottom wall of the IC accommodating section 1a, guide pins 10 and 1h projecting from each corner of the accommodating section 1a being inserted into a cut-out 3e formed in each corner of the pedestal 3 in order to guide the IC pedestal 3 to an upper and a lower positions within the IC accommodating section 1a, a hook 3c formed on the leg portion 3b being brought into engagement with a lower edge of the guide hole 1b, thereby to limit the moving amount of the IC pedestal 3 toward the upper position.

Figure 5:
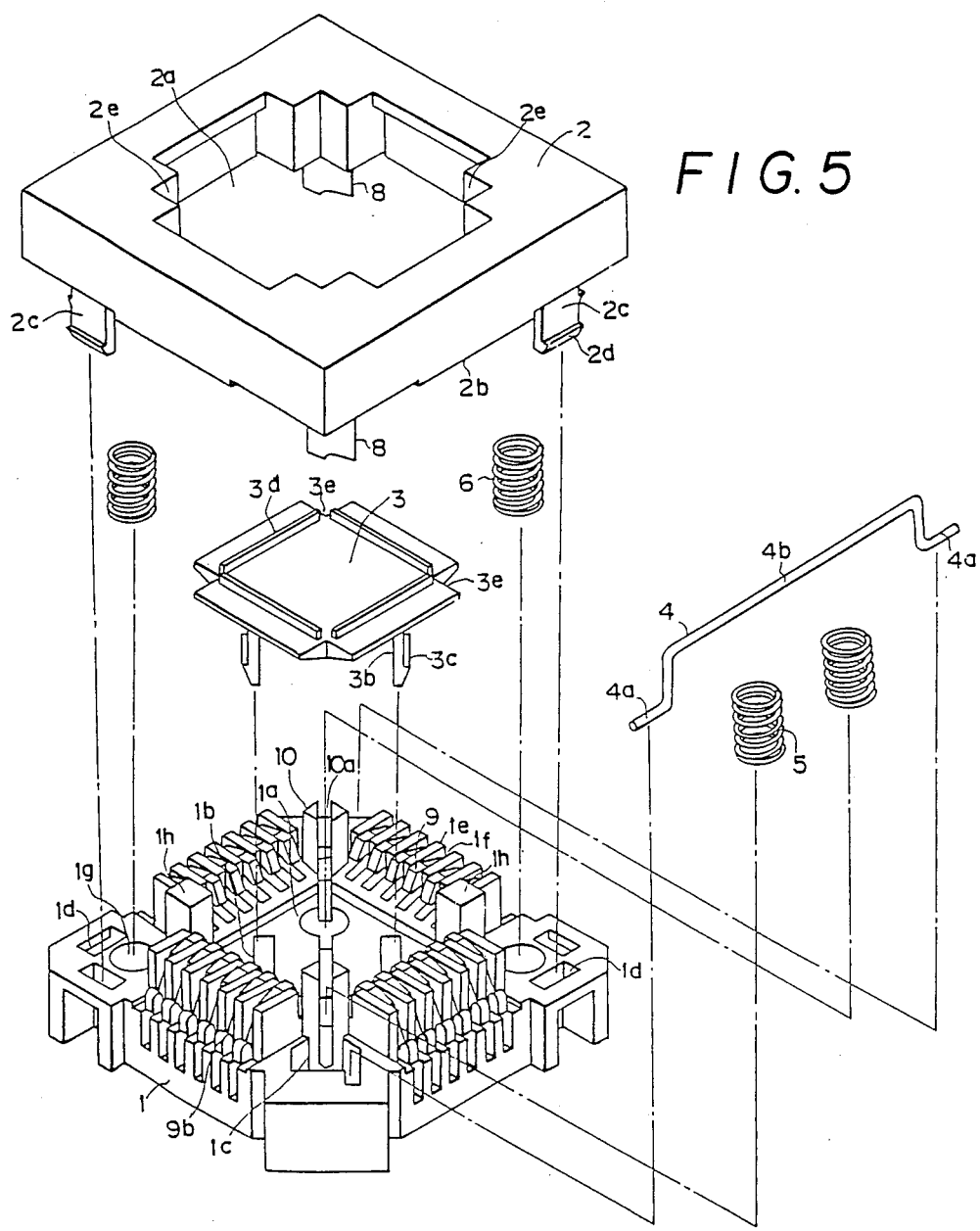
FIG. 5 is an exploded perspective view of the IC socket.
Figure 6:
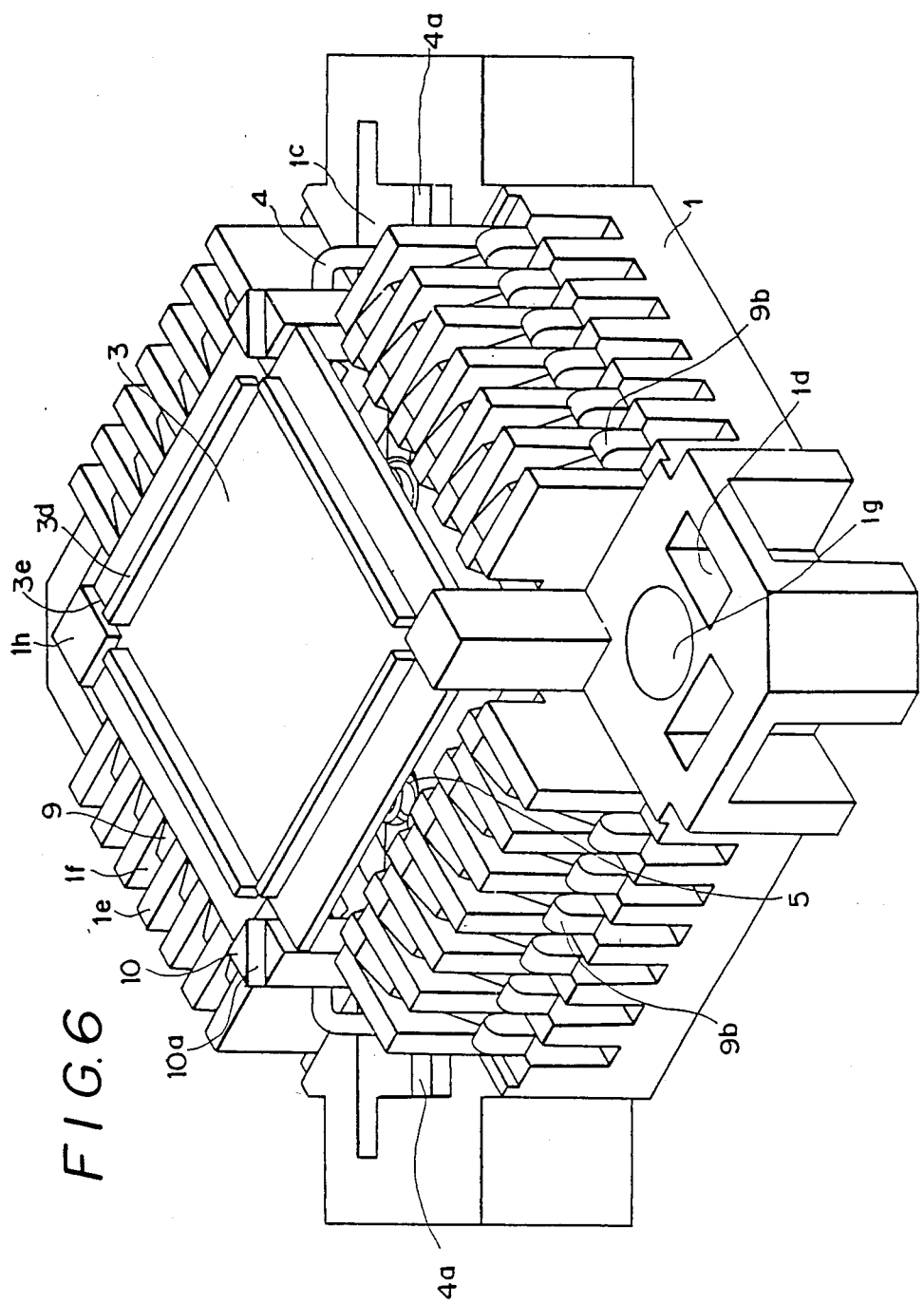
FIG. 6 is a perspective view of the above but from which the framework is removed.
Figure 7:
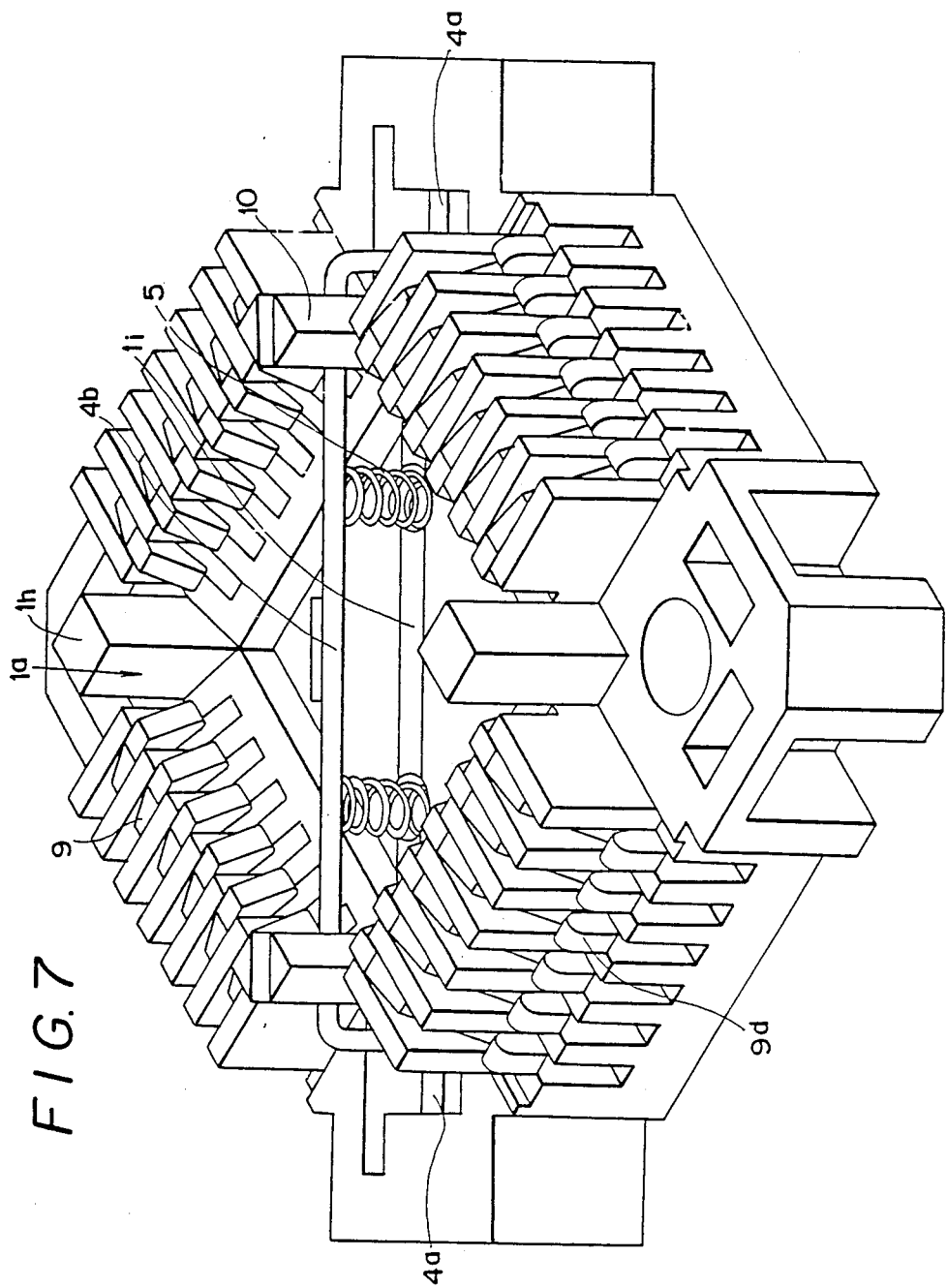
FIG. 7 is a perspective view of the above but from which the framework and the IC pedestal are removed.
Figure 8:
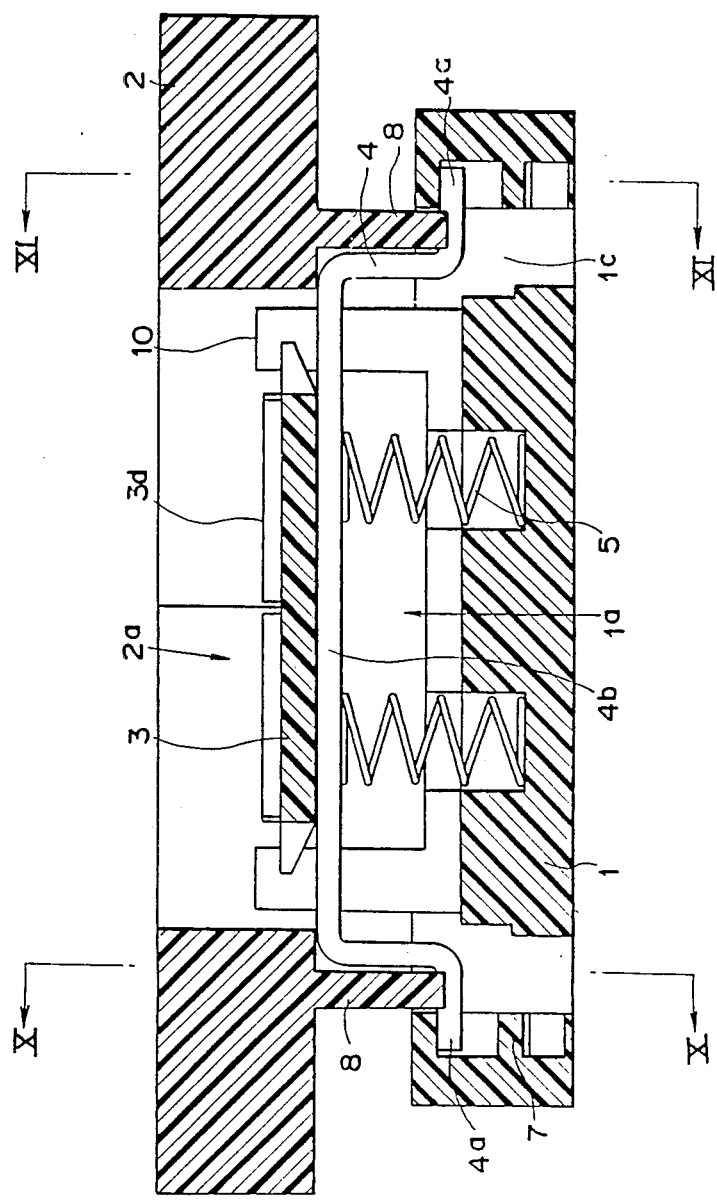
FIG. 8 is a sectional view taken on line VIII—VIII of FIG. 2.

The pedestal supporting member 4, as shown in FIG. 5, comprises a wire material having a circular shape in section, each end of the wire material being bent in L-shape to form a crankshaft. The crankshaft is laid down on one diagonal line of the IC accommodating section 1a. The portion of the crankshaft laid down on the diagonal line of the IC accommodating section 1a forms a pedestal supporting portion 4b. The lower surface of the IC pedestal 3 is supported by the pedestal supporting portion 4b in a non-connected fashion. The L-shaped portion formed at each end of the crankshaft forms an engaging piece 4l. The engaging piece 4a is brought into engagement with and disengaged from a lock means 7 as will be described. The crankshaft forming the pedestal supporting portion 4 can be approached to and separated away from the IC pedestal 3 in the vertical direction and is swingable. In order to properly move the pedestal supporting member 4 between the upper and the lower positions, both ends of the pedestal supporting member 4b are brought into slide-fit into a vertical guide groove 10a formed in the guide pin 10. The pedestal supporting member is moved in the vertical direction along the guide groove 10a and is swung on the vertical movement line.

The pedestal supporting portion 4b of the pedestal supporting member 4 is resiliently held by the first spring means 5. The pedestal supporting member 4 is energized by the biasing force of the first spring means 5 so that the member 4 is pushed up toward the upper position. At the same time, the IC pedestal 3 is pushed up toward the upper position by the first spring means 5 through the pedestal supporting member 4. The pedestal 3 is moved downward to the lower position together with the pedestal supporting member 4 against the force of the first spring means 5. The force for moving the pedestal 3 and the pedestal supporting member 4 is rendered by the IC vertical movement operating means.

The IC vertical movement operating means comprises, for example, a framework 2. An IC inlet/outlet port 2a comprises, for example, a window formed in the framework 2. The framework 2 is disposed as such that the IC inlet/outlet port 2a and the pedestal 3 are corresponded with each other. The framemwork 2 is provided with legs 2c projecting downward therefrom. The legs 2c are vertically movably inserted into guide holes 1d formed in a pair of angular portions of the socket substrate 1, and the guide pins 10 and 1h projecting from the angular portions of the IC accommodating section 1a are inserted into the cut-outs 2e formed in the angular portions of the IC inlet/outlet port 2a in order to guide the framework 2 to the upper and the lower positions. The hook 2d formed on the leg 2c is brought into engagement with the lower edge of the guide hole 1d in order to limit the moving amount of the framework 2 toward the upper position.

A second spring means 6 is disposed between the angular portion of the framework 2 and the angular portion of the socket substrate 1. The framework 2 is energized by the second spring mean 2 as such that the framework 2 is pushed up toward the upper position. The framework 2 as the IC vertical movement operating means is moved to the lower position against the force of the second spring means 6 and returned to the upper position according to the force of the second spring means 6.

As described in the foregoing, the framework 2 forms an IC vertical movement operating means and has such an function as to push down the IC supporting means to engage with or disengage from the lock means. The framework 2 is provided with pair of pushers 8 adapted to push down the IC supporting means. The pushers 8 are projected downward from the lower surface at a pair of angular portions on a diagonal line of the framework 2. The pushers 8 are inserted into pusher inserting holes 1c formed in a pair of angular portions of the socket substrate in order to pressurize the engaging piece 4a of the pedestal supporting member 4 comprising the craftshaft.

The IC accommodating portion 1a of the socket substrate 1 is provided at a pair of angular portions thereof each with the lock means 7. The engaging piece 4a of the pedestal supporting member 4 is disposed in such a manner as to be able to engage with and disengage from the lock means 7. The lock means 7 is caused to retain the engaging piece 4a to a lower engaging portion 7d means of the first push-down operation of the framework 2 as the IC vertical movement operating means. By the second push-down operation of the framework 2 as the IC vertical movement operating means, the engaging piece 4a is retained to an upper engaging portion 7a. Due to the retainment by the lower retaining portion 7d, the pedestal supporting member 4 is held in the lower position against the force of the first spring means 5. Similarly, due to the retainment of the upper retaining portion 7a, the pedestal supporting member 4 is held in the upper position in accordance with the biasing force of the first spring means. As lock means mentioned, there may be employed a cam mechanism such as a hart cam or the like which is used in, for example, a push and push switch.

A concrete constitution relating to the cam mechanism and the function thereof will now be described with reference to FIGS. 9 through 23.

Figure 9:
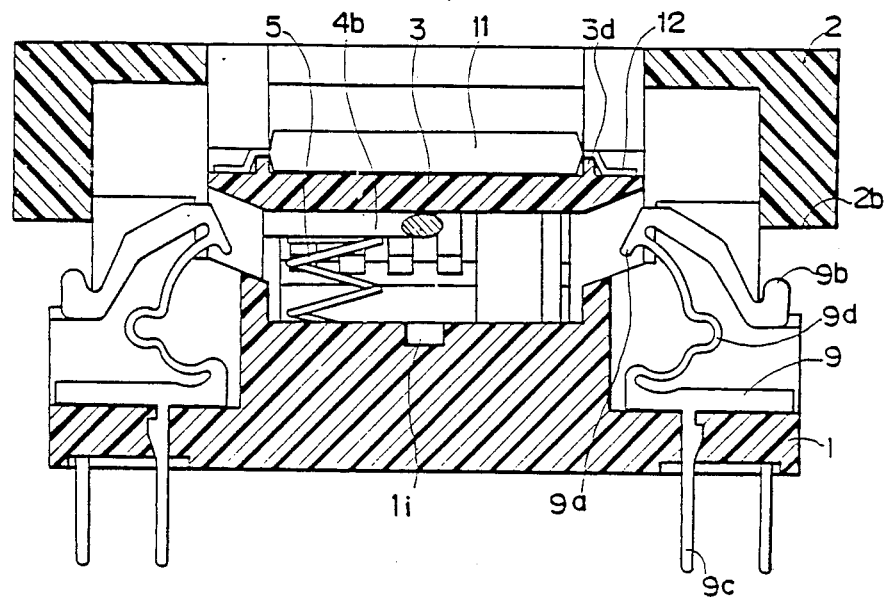
FIGS. 9, 10 and 11 are illustrations for explaining a first stage of operation of the IC socket.
Figure 10:
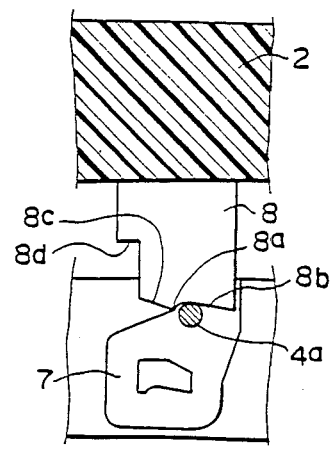
Figure 11:
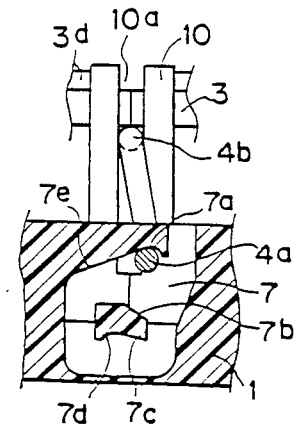

As is shown in FIGS. 9 through 11, when the IC pedestal 3 is in the upper position, the IC 11 is mounted on the pedestal 3, the IC 11 is supported the root portions of the leads by lead supporting projections 3d, which are provided at four sides or two sides on the upper surface of the pedestal 3, and correctly positioned. At this time, the pedestal supporting member 4 is urged upwardly by the first spring means 5, the engaging piece 4a at the end portion of the supporting member 4 being retained by the upper retaining portion 7a of the lock means 7. By this, the IC pedestal 3 is held in the upper position.

The framework 2, which forms the vertical movement operating means, is supported the pusher 8 on the engaging piece 4a which is retained in the upper position and is held in the upper position by the push-up force of the second spring means 6.

Figure 12:
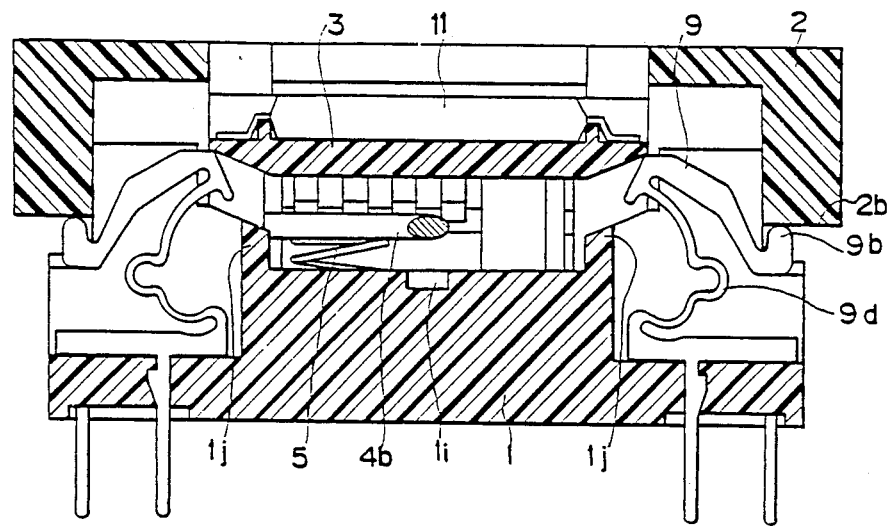
FIGS. 12, 13 and 14 are illustrations for explaining a second stage of operation thereof.
Figure 13:
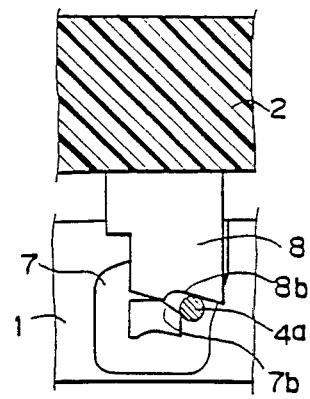
Figure 14:
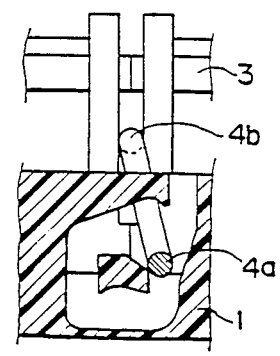

As is shown in FIGS. 12 through 14, in the state of FIGS. 9 through 11, if the framework 2 is pushed downward against the force of the second spring means 6, the contact presser portion 2b provided on the lower surface of the outer periphery of the framework 2 hits the pressure receiving portion 9b of the contact 9 to start of the pushing operation. At the same time, the engaging piece 4a provided on the end portion of the pedestal supporting member 4 is pushed downward by the projection 8a provided on the front end of the pusher 8 of the framework 2 against the force of the first spring means 5 and is then moved downward at angles by an inclined guide surface 7b of the lock means 7. As a result, the pedestal supporting portion 4b is vertically moved downward. The pedestal 3 is vertically moved downward following the downward movement of the pedestal supporting portion 4b and stopped when the peripheral portion of the pedestal 3 sits on the contact 9.

Figure 15:
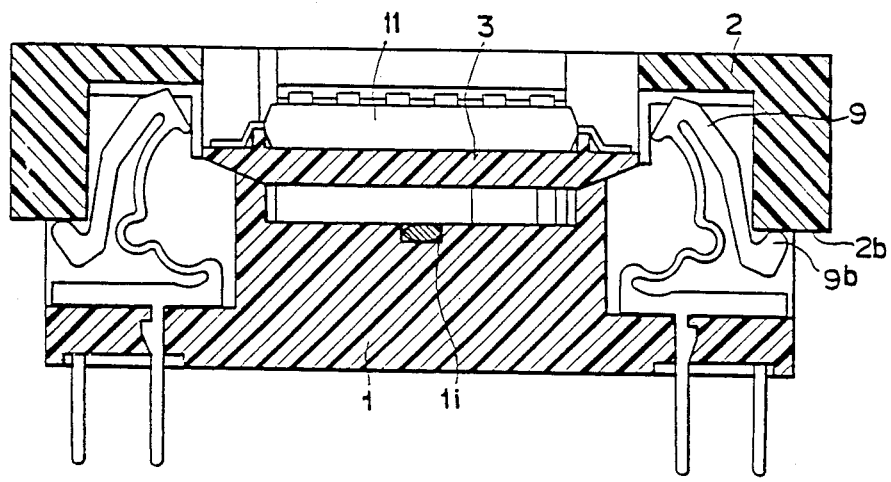
FIGS. 15, 16 and 17 are illustrations for explaining a third stage of operation thereof.
Figure 16:
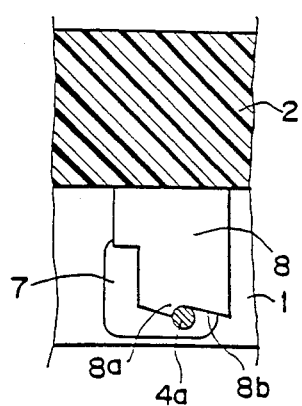
Figure 17:
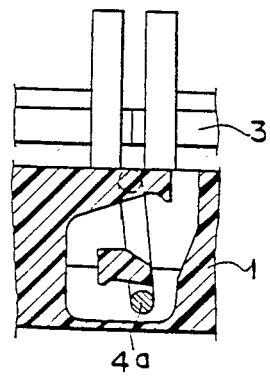

As is shown in FIGS. 15 through 17, if the framework 2 is moved downward until the lower surface of the framework 2 hits the upper surface of the socket substrate 1, the engaging piece 4a is further pushed down by the pusher 8 to move the pedestal supporting portion 4b to a dead point generally thereunder and accommodated in a shaft accommodating groove 1i formed in the bottom surface of the IC accommodating section. At the same time, the pressure receiving portion 9b of the contact is pushed down by the contact presser portion 2b of the framework 2 against the force of the spring portion 9d. As a result, the contact portion 9a is resiliently displaced in the upper and external direction at angles. As a result, the IC pedestal 3 with the IC 11 supported thereon loses the support of the contact 9 and falls by its own gravity. The IC pedestal 3 with the IC 11 thereon is then received by a pedestal mounting portion 1j disposed at the periphery of the IC accommodating section of the socket substrate 1 and held in the lower position. At this time, the pedestal 3 and the pedestal supporting portion 4b are spaced apart with each other with a tiny space therebetween.

Figure 18:
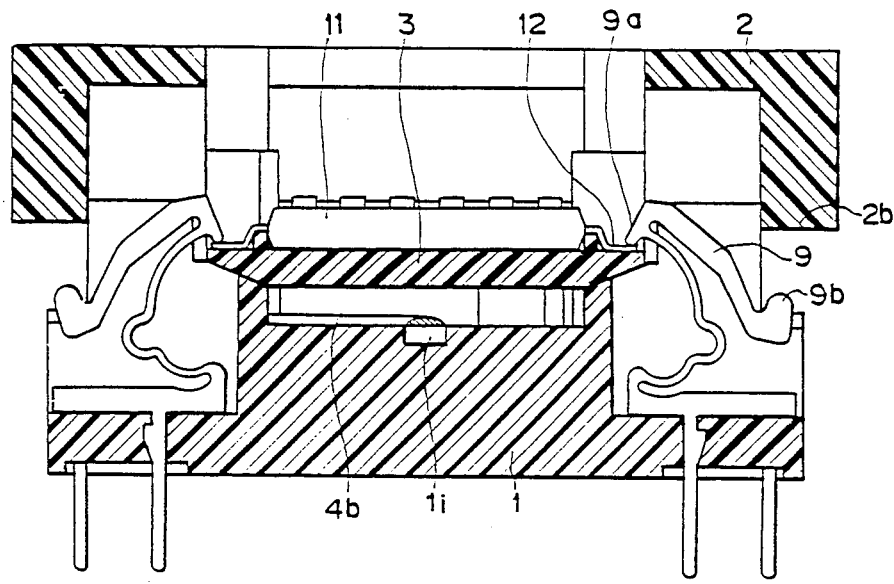
FIGS. 18, 19 and 20 are illustrations for explaining a fourth stage of operation thereof.
Figure 19:
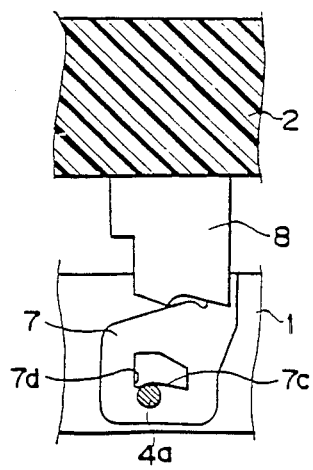
Figure 20:
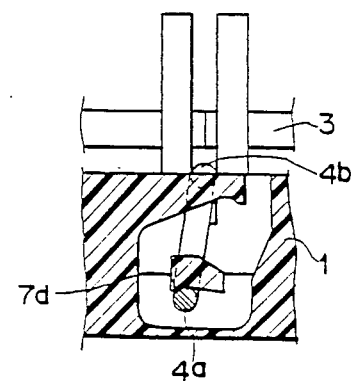

As is shown in FIGS. 18 through 20, if the force for pushing down the framework 2 is released, the framework 2 is pushed upward by the biasing force of the second spring means 6 and arrived at the upper position. The engaging piece 4a of the pedestal supporting member 4 is guided to the lower retaining portion 7d by the inclined guide surface 7c of the lock means 7 and held. As a result, the pedestal 3 keeps its fallen-down state in the lower position. If the force for pushing down the framework 2 is released, since the force incurred to the pressure receiving portion 9b by the contact presser portion 2b is removed, the contact portion 9a is tended to restored in the forward and downward direction at angles by the resilient force of the spring portion 9d. However, since the IC pedestal 3 and the IC 11 are brought to be in the lower position by the afore-mentioned procedure, the contact portion 9a sits on the upper surface of the IC lead 12 and is tended to restore to its original position by the resilient force stored, thereby to pressurize the lead 12 from the inclined upper direction to obtain a pressure contact.

Figure 21:
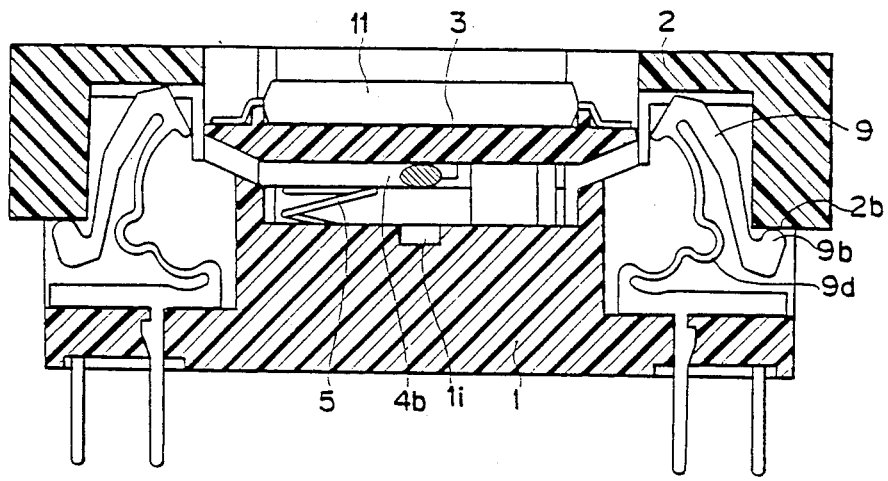
FIGS. 21, 22 and 23 are illustrations for explaining a fifth stage of operation thereof.
Figure 22:
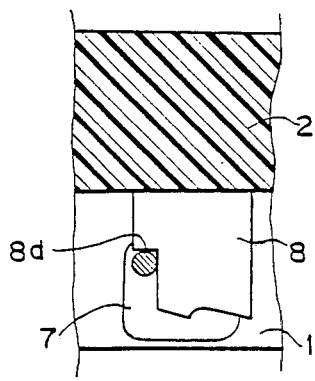
Figure 23:
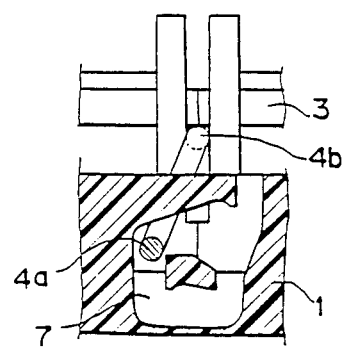

As is shown in FIGS. 21 through 23, if the framework 2 waiting in the upper position is pushed down to the dead point again against the force of the second spring means 6 from the afore-mentioned contacting state, the pressure receiving portion 9b of the contact 9 is pushed down again by the contact presser portion 2b of the framework 2. As a result, the contact portion 9a is resiliently displaced in the external and upper direction at angles against the force of the spring portion 9d to release the pedestal 3 and the IC 11. On the other hand, the engaging piece 4a of the pedestal supporting member 4 is guided by the inclined guide surface 8c formed at the front end of the pusher 8 and disengaged from the lower retaining portion 7d of the lock means 7. Then, the engaging piece 4a of the pedestal supporting member 4 is turned toward the internal surface of the pusher 8 and retained by a step portion 8d. As a result of the disengagement, the pedestal supporting member 4 is moved upward by the resilient force of the first spring means 5 and the pedestal supporting portion 4b is also moved upward. As a result, the pedestal 3 is pushed upward to the upper position. If the force for pushing down the framework 2 is released thereafter, the framework 2 is pushed up to the upper position by the second spring means 6 and waits for the second push-down operation given to the framework 2, as shown in FIGS. 9 through 11, the engaging piece 4a of the pedestal supporting member 4 is guided by the inclined guide surface 7e of the lock means 7 and retained by the upper retaining portion 7a. As a result, the pedestal 3 is held in the upper position again by the pedestal supporting portion 4b.

Since the force acting on the pressure receiving portion 9b of the contact 9 is removed as a result of the push-up of the framework 2, the contact portion 9a is resiliently displaced in the forward and downward direction by the resilient force of the spring portion 9d and returned to the original position.

In the state where the pedestal 3 is pushed up and situated in the upper position, the IC 11 on the pedestal 3 can easily be removed through the inlet/outlet port 2a of the IC 11.

FIG. 24 illustrates another embodiment in which the pedestal supporting member 4 comprises the crankshaft and the pedestal supporting 4b is provided with a swingable seat board 13, so that the lower surface of the pedestal 3 is supported by the seat board 13.

FIGS. 26A, 26B and 26C are illustrations for explaining the action thereof. In FIG. 26A, the IC pedestal 3 is pushed up to the upper position by the seat board 13. In FIG. 26B, the seat board 13 is retained in the lower position by the first push-down operation of the framework 2 and the pedestal 3 is falling and contacted with a slight space left therebetween. In FIG. 26C, the framework 2 is pushed down again and the seat board 13 is pushed down by the pedestal 3 in order to release the retainment of the pedestal supporting member 4 with respect to the lock means.

Furthermore, in FIGS. 25A and 25B, the pedestal supporting member 4 comprising the crankshaft is loosely connected to the pedestal 3 by a joint 14. More specifically, the pedestal supporting member 4 is vertically movable in the perpendicular direction with respect to the pedestal 3 and swingably connected on the line for vertical movement to attain the same purpose.

FIGS. 27A, 27B and 27C are illustrations for explaining the action thereof. IN FIG. 27A, the IC pedestal 3 is pushed up to the upper position by the supporting member 4. In FIG. 27B, the supporting member 4 is retained in the lower position by the second push-down operation of the framework 2, and the pedestal 3 is falling and contacted with the IC with a slight space left therebetween. IN FIG. 27C, the framework 2 is pushed down again to push down by the pedestal 3, the supporting member 4 being pushed down by the pedestal 3 thereby to release the retainment of the supporting member 4 with respect to the lock means.

As described in the foregoing, the IC mounted on the IC supporting table can be moved to the lower position without incurring any external force such as direct pressing load to the IC by means of pressing operation of the IC vertical movement operating means, so that the IC supporting means is brought into engagement with the lock means and so that the IC is brought into contact with the contact. Therefore, the IC can be moved between the upper and lower positions without incurring an undesirable pressing force. Therefore, there can effectively prevent the occurrence of undesirable incidents such as displacement of the IC, deformation of the lead or contact, erroneous contact of the lead and contact, etc. which are frequently occurred when the IC is directly pressed by finger.

Furthermore, according to the present invention, since the IC vertical movement operating means is normally returned to and waiting in the upper position even when the IC and the IC supporting table are pushed in the socket substrate situated in the lower position, the next following pressing operation can be performed easily, and a first and a second pressing operation can be properly performed always under the same condition. In addition, the IC can easily be moved to the upper and the lower positions by the pressing operation of the vertical movement operating member.

What is claimed is:

1. An IC socket comprising an IC supporting means which can be moved between an upper and a lower positions with an IC mounted thereon;

a first spring means for energizing said IC supporting means so that said IC supporting means is pushed up to the upper position;

a contact for contacting with a lead of the IC when said IC supporting means is moved to the lower position against the force of said first spring means;

an IC vertical movement operating means which can be moved between the upper and lower positions and adapted to push down said IC supporting means against said first spring means;

a second spring means for energizing said IC vertical movement operating means so as to push up the same to the upper position; and a lock means for retaining said IC supporting means to the lower position against the force of said first spring means by the vertical movement operation of said IC vertical movement operating means against the force of said second spring means or in accordance with the force of said second spring means so that the IC is brought into contact with said contact, the retaining of said IC supporting means being released by the second vertical movement operation of said IC vertical movement operating means to allow said IC supporting means to be moved to the upper position in accordance with the force of said spring means.

2. An IC socket as claimed in claim 1, wherein said IC supporting means includes an IC pedestal and a pedestal supporting member which is provided with an engaging piece which is loosely connected to said IC pedestal so that said engaging piece can be swung and moved in the vertical direction and subjected to the engagement or disengagement with respect to said lock means.

3. An IC socket as claimed in claim 1, wherein said IC vertical movement operating means comprises a framework, and said framework is provided with a window serving as an inlet port for the IC mounted on said IC supporting means.

4. An IC socket as claimed in claim 1, wherein said IC supporting means comprises an IC pedestal with the IC mounted thereon, and a pedestal supporting member for supporting said IC pedestal in a non-contact fashion and having an engaging piece which is subjected to the engagement or disengagement with respect to said lock means, and said first spring means is disposed as such that said first spring means pushes up said pedestal supporting member to indirectly push up said IC pedestal.

5. An IC socket as claimed in claim 4, wherein said pedestal supporting member includes a seat board for supporting the pedestal.

* * * * *